United States Patent
Lupulescu et al.

(10) Patent No.: US 7,276,903 B2
(45) Date of Patent: Oct. 2, 2007

(54) QUADRUPOLAR NUCLEI NMR USING RESIDUAL DIPOLAR SPLITTINGS IN SOLIDS

(75) Inventors: Adonis Lupulescu, Crissier (CH); Sasa Antonijevic, Lausanne (CH); Geoffrey Bodenhausen, Paris (FR)

(73) Assignee: Ecole Polytechnique Fédérale de Lausanne, Lausanne (CH)

( * ) Notice: Subject to any disclaimer, the term of this patent is extended or adjusted under 35 U.S.C. 154(b) by 0 days.

(21) Appl. No.: 11/448,857

(22) Filed: Jun. 8, 2006

(65) Prior Publication Data
US 2007/0013373 A1 Jan. 18, 2007

(30) Foreign Application Priority Data
Jul. 14, 2005 (EP) ................... 05015334

(51) Int. Cl.
G01V 3/00 (2006.01)
(52) U.S. Cl. .................................... 324/307
(58) Field of Classification Search ......... 324/300–322
See application file for complete search history.

(56) References Cited

U.S. PATENT DOCUMENTS

| | | | | |
|---|---|---|---|---|
| 5,327,087 A | * | 7/1994 | Hafner et al. ............... | 324/309 |
| 5,345,174 A | * | 9/1994 | Kimmich et al. ........... | 324/309 |
| 6,144,199 A | * | 11/2000 | Sharf et al. .................. | 324/306 |
| 6,373,250 B1 | * | 4/2002 | Tsoref et al. ............... | 324/309 |
| 2003/0071619 A1 | * | 4/2003 | Sauer et al. ................. | 324/307 |
| 2004/0167751 A1 | * | 8/2004 | Mitschang ................... | 702/198 |

OTHER PUBLICATIONS

D. Massiot et al. "Chemical bonding differences evidenced from J-coupling in solid state NMR experiments involving quadrupolar nuclei". Journal of Magnetic Resonance, Academic Press, Orlando, FL, US, vol. 164, No, 1, Sep. 2003, pp. 160-164.
S.E. Ashbrook et al. "Multiple-quantum cross-polarization in MAS NMR of quadrupolar nuclei". Chemical Physics Letters, vol. 288, 1998, pp. 509-517.
R. K. Harris et al. "Quadrupolar Effects Transferred to Spin-½ Magic-Angle Spinning Spectra of Solids". Progress in NMR Spectroscopy, vol. 24, 1992, pp. 435-456.
K. Ermolaev, B.M. Fung "High-resolution $^{14}$N NMR in polycrystalline solids". J. Chem. Phys. 1999, 110, 7977.

(Continued)

Primary Examiner—Brij Shrivastav
Assistant Examiner—Dixomara Vargas
(74) Attorney, Agent, or Firm—Dr. Paul Vincent

(57) ABSTRACT

A method for obtaining NMR (=nuclear magnetic resonance) spectra of quadrupolar nuclei having spin I>½ using magic angle spinning (=MAS) in solid powders and transfer of coherences from a neighboring nucleus with spin S=½ to single- or double-quantum transitions of quadrupolar nuclei having spin I>½, is characterized in that the transfer of coherences occurs through a combination of scalar and residual dipolar splittings. With the inventive method improved NMR-spectra can be obtained from which parameters can be extracted, which can be related to the structure and internal dynamics of solids containing the quadrupolar nuclei.

8 Claims, 8 Drawing Sheets

OTHER PUBLICATIONS

H.J. Jakobsen, B.M. Bildsoe, J. Skibsted, T. Giavania, "$^{14}$N MAS NMR Spectroscopy: The Nitrate Ion" J. Am. Chem. Soc. 2001, 123, 5098.

P. Brunner, M. Reinhold, R.R. Ernst "Double quantum cross polarization. Heteronuclear excitation and detection of NMR double quantum transitions in solids". J. Chem Phys. 1980, 73, 1086.

R. Tycko, P.L. Stewart, S.J. Opella "Peptide Plane Orientations Determined by Fundamental and Overtone $^{14}$N NMR". J.Am. Chem. Soc. 1986, 108, 5419-5425.

C.P. Grey, W.S. Ceeman "The detection of weak heteronuclear coupling between spin ½ nuclei in MAS NMR; $^{14}$N/$^{13}$C/$^{1}$H triple resonance experiments". Chem. Phys. Lett., 1992, vol. 192, 379.

C.P. Grey, A.P. Eijkelenboom, W.S. Veeman "14N Population transfers in two dimensional $^{13}$C-$^{14}$N-$^{1}$H triple-resonance magic-angle spinning nuclear magnetic resonance spectroscopy". Solid State Nucl. Magn. Reson., 1995, vol. 4, 113-120.

Wi Sungsool, L. Frydman "Heteronuclear Recoupling in Solid-State Magic-Angle-Spinning NMR via Overtone Irradiation". J. Am. Chem. Soc., 2001, vol. 123, 10354-10361.

S. Antononijevic, G. Bodenhausen "High-Resolution NMR Spectroscopy in Solids by Truly Magic-Angle Spinning". Angew. Chem. Int. Ed. 2005, vol. 44, 2935-2938.

\* cited by examiner

QUADRUPOLAR NUCLEI NMR USING RESIDUAL DIPOLAR SPLITTINGS IN SOLIDS

This application claims Paris Convention priority of EP 05 015 334.5 filed Jul. 14, 2005 the entire disclosure of which is hereby incorporated by reference

BACKGROUND OF THE INVENTION

The invention concerns a method for obtaining NMR (=nuclear magnetic resonance) spectra of quadrupolar nuclei having spin I>½ using magic angle spinning (=MAS) in solid powders and transfer of coherences from a neighboring nucleus with spin S=½ to single- or double-quantum transitions of quadrupolar nuclei having spin I>½.

A method for obtaining NMR (=nuclear magnetic resonance) spectra of quadrupolar nuclei having spin I>½ is known from [32]-[36].

Although nitrogen is of universal importance in virtually all branches of biology, chemistry, and material science, and although nitrogen-14 is a very abundant isotope (99.4%), nitrogen-14 NMR has enjoyed relatively little popularity so far. In liquids, nitrogen-14 line-widths are very broad because of rapid quadrupolar relaxation, except in rapidly-tumbling molecules or in highly symmetrical environments such in tetraalkyl ammonium ions.[1] In solids, nitrogen-14 quadrupole interactions can be characterized in the absence of external magnetic fields by nuclear quadrupole resonance (NQR).[2, 3] In a static magnetic field, the strong quadrupole interaction between the nuclear quadrupole moment of a spin I=1 and the electric field gradient (EFG) at the site of the nucleus leads to very broad spectra (up to a few MHz) that are difficult to excite and observe.[4-8] The interaction of a nucleus with a quadrupole moment Q with the electric field gradient V at the site of the nucleus can be characterized by the quadrupole coupling constant $C_Q = eQV_{ZZ}/h$ and the asymmetry parameter $\eta_Q = (V_{XX} - V_{YY})/V_{ZZ}$, where the principal components of the electric field gradient tensor are ordered $V_{ZZ} > V_{XX} > V_{YY}$. The asymmetry parameters $\eta_Q$ can cover the full range $0 < \eta_Q < 1$.

Early examples of direct detection of $^{14}$N NMR used single crystals,[4-8] where one obtains a doublet for each $^{14}$N site, with reasonably narrow spectral lines (on the order of 1.5 kHz for $C_Q \approx 3$-4 MHz), provided that there are no significant crystal imperfections. The signals are spread over spectral ranges of several MHz, requiring very broad bandwidths (or re-tuning of the circuits) for both excitation and signal acquisition. In static polycrystalline powders, the $^{14}$N signal intensity is spread over many MHz, so that it is difficult to recognize the singularities of the powder patterns. When the powders are spun at the magic angle, one observes families of spinning sidebands. Although for moderate spinning frequencies the signal intensity can be spread over hundreds of sidebands, quadrupole couplings up to $C_Q = 1.5$ MHz have been observed by direct $^{14}$N MAS.[9-13] Not surprisingly, the envelopes of the spinning sidebands depend not only on the accurate adjustment of the magic angle, but also on the amplitude of the $^{14}$N radio-frequency pulses and on the bandwidth of the probe and receiver systems.

The frequencies of double-quantum transitions between the |m=+1> and |m=−1> levels in I=1 systems are not affected by first-order quadrupolar interactions, as shown for $^2$H NMR by Pines and co-workers.[14] In combination with cross-polarization between $^{14}$N (I=1) and suitable S nuclei, one can excite $^{14}$N double-quantum coherences.[15-17] By transferring coherence back and forth between $^{14}$N double-quantum coherences and S nuclei, one can achieve indirect detection.

The $^{14}$N double-quantum transitions can also be detected directly by overtone spectroscopy,[18-22] where a radio-frequency field centered at twice the $^{14}$N Larmor frequency. This exploits the fact that double-quantum transitions are weakly allowed. Second-order quadrupole couplings, as shown in single crystals and powders, determine the line-shapes in overtone spectra.[18-22] Compounds with several $^{14}$N sites may lead to overlapping overtone patterns, which can in principle be separated by combining overtone spectroscopy with dynamic-angle spinning or with double sample rotation.[23-27]

It is possible to achieve indirect detection of $^{14}$N in spinning samples by recoupling heteronuclear dipolar interactions with a suitable spin S such as $^{13}$C.[28-30] By applying pulses at $\omega_0^N$ in synchronism with sample rotation, one can interfere with the averaging of heteronuclear dipolar interactions. This leads to a dephasing of the signals of the S nuclei, thus providing information on the strength of the dipolar interaction. Recoupling can also be achieved by $^{14}$N irradiation near the overtone frequency.[31, 32] By stepping the RF frequency in the vicinity of $\omega_0^N$ or $2\omega_0^N$, one obtains line shapes determined by first- or second-order quadrupole interactions respectively.[31] This may be regarded as continuous-wave approach to indirect detection of $^{14}$N spectra.

Another class of experiments exploits residual dipolar splitting (RDS), also known as second-order quadrupole-dipole cross term, between $^{14}$N (I=1) and S=½ nuclei such as $^{13}$C.[32-36] Since the IS dipolar interactions are not averaged out completely by magic angle spinning, because the large quadrupole coupling of the I nucleus prevents its quantization along the direction of the static field, the S resonances are split into 1:2 doublets (each component featuring a narrow powder pattern) with a splitting D, which depends on the orientation of the C-N bond with respect to the quadrupole tensor. The largest peak corresponds to the superposition of the |m=+1> and |m=−1> states of the S=1 spin, while the smaller peak corresponds to the |m=0> state. The former is further split into a doublet 2J due to the heteronuclear J coupling. Inhomogeneous broadening or relaxation may of course mask these splittings. Residual dipolar splittings have been used by Clare et al.,[29] who stepped an RF field in the vicinity of $\omega_0^N$ while observing two-dimensional exchange spectra of the S ($^{13}$C) nuclei. If the RF field is applied for a duration comparable to the rotor period, the populations of the $^{14}$N levels are partly interchanged. As a result, the two components of the doublet in the S ($^{13}$C) spectrum are swapped.[29]

It is the object of the invention to present a method for obtaining NMR spectra of quadrupolar nuclei having spin I>½ which overcomes the above mentioned problems.

SUMMARY OF THE INVENTION

This object is achieved, according to the invention, by a method mentioned above, characterized in that the transfer of coherences occurs through a combination of scalar and residual dipolar splittings. The inventive method enables one to achieve NMR-spectra that reveal patterns of quadrupolar couplings of the quadrupolar nuclei with extremely narrow line widths. Therefore improved NMR-spectra can be obtained from which parameters can be extracted, which can be related to the structure and internal dynamics of solids containing the quadrupolar nuclei.

The quadrupolar nuclei having spin I>½ are preferably chosen from the group $^{14}$N, $^{17}$O, $^{35}$Cl, $^{37}$Cl. Because of its great importance in biology, chemistry and material science $^{14}$N is highly preferred.

In a highly preferred variant the inventive method includes the following steps:
(i) excitation of the neighboring nucleus single quantum coherence by cross polarization from protons,
(ii) applying a delay of $T_{exc} \approx \frac{1}{2}D$, where D is the splitting due to a combination of scalar and residual dipolar splittings,
(iii) applying an RF-pulse of duration $\tau_P$ to the quadrupolar nuclei having spin I>½,
(iv) applying a $\pi$-RF-pulse to the neighboring nucleus in the middle of an evolution interval $t_1$,
(v) applying an RF-pulse at $t_1$ of duration $\tau_P$ to the quadrupolar nuclei having spin I>½, and
(vi) recording the signal of the neighboring nucleus with spin S=½ after a duration $\tau_{rec} \approx \frac{1}{2}D$.

The neighboring nucleus with spin S=½ is preferably chosen from the group $^{13}$C, $^{31}$P, $^{15}$N, $^{29}$Si, $^{1}$H.

Advantageously the steps (i) to (vi) are repeated for N rotor-synchronized increments $t_1 = n\Delta t_1$ with $\Delta t_1 = 1/v_{rot}$ and n=1, 2, 3 ... N in the manner of 2-dimensional spectroscopy.

In a preferred variant the time domain signals $S(t_1, t_2)$ are Fourier transformed with respect to $t_1$ to yield a spectrum of the quadrupolar nuclei having spin I>½ in the $\omega_1$ domain and with respect to $t_2$ to yield a spectrum of the neighboring nucleus with S=½ in the $\omega_2$ domain.

A variant of the NMR method according to the invention is characterized in that $(\pi/2)_\phi$ pulses are applied to the neighboring nucleus with S=½ at the beginning and at the end of an evolution interval $t_1$. Therewith the heteronuclear coherences can be converted into coherences of the I=½ nucleus.

Also in accordance with the invention is a variant of the method wherein a z-filter is used before the detection period. The excitation and reconversion are then symmetrical in time domain, which improves the spectra.

Further it is preferred, that from the obtained NMR spectra the quadrupolar coupling constant $C_Q$, the asymmetry parameter $\eta_Q$ of the quadrupolar nuclei having spin I>½ and the relative orientation of the quadrupolar tensor with respect to the bond between the quadrupolar nuclei having spin I>½ and the neighboring nucleus with S=½ are extracted.

It is shown that nuclear magnetic resonance (NMR) spectra of nitrogen-14 (spin I=1, with quadrupole couplings up to a few MHz) can be obtained by indirect detection in powders spinning at the magic angle (MAS). The method relies on the transfer of coherence from a neighboring nucleus with S=½ such as carbon-13 to single- or double-quantum transitions of nitrogen-14 nuclei. The transfer of coherence occurs through a combination of scalar and residual dipolar splittings, the latter being also known as second-order quadrupole-dipole cross terms. The two-dimensional (2D) NMR spectra reveal powder patterns determined by second-order quadrupolar couplings of nitrogen-14, which have line-widths that are about three orders of magnitude narrower than the first-order quadrupolar interaction.

Analysis of the spectra yields the quadrupolar coupling constant $C_Q$ and asymmetry parameter $\eta_Q$ of nitrogen-14 and the relative orientation of the quadrupolar tensor with respect to the bond between the nitrogen-14 and S nuclei. These parameters, which can be subject to motional averaging, can be related to the structure and internal dynamics of nitrogen-containing solids.

Further advantages can be extracted from the description and the enclosed drawing. The features mentioned above and below can be used in accordance with the invention either individually or collectively in any combination. The embodiments mentioned are not to be understood as exhaustive enumeration but rather have exemplary character for the description of the invention.

The invention is shown in the drawings.

DESCRIPTION OF THE PREFERRED EMBODIMENT

The method presented in this work exploits residual dipolar splittings between $^{14}$N (I=1) and a "spy" nucleus with S=½ such as $^{13}$C, in combination with scalar J couplings. The residual splitting $D(^{14}N, ^{13}C)$, which decreases in inverse proportion to the static field strength $B_0$, is on the order of $D \approx 30$ Hz for $^{14}NH_3^{+13}C^\alpha HRCOO^-$ in zwitterionic amino acids at $B_0 = 9.4$ T (400 MHz for protons), while $J(^{14}N, ^{13}C)$ couplings in L-alanine are about 3.1 and 4.0 Hz for $^{14}NH_3^+R$ and $^{14}NH_2R$ respectively, and around 8 Hz in peptide bonds.[37] If the magic angle is adjusted very accurately,[38] and if proton decoupling is optimized,[39, 40] the $^{13}C^\alpha$ lines of amino acids can be as narrow as 18 Hz, so that the residual dipolar splitting can readily be observed.[38] Even when the splittings are masked by inhomogeneous broadening, due to slight errors in the adjustment of the magic angle, temperature gradients, or magnetic susceptibility effects, the residual dipolar splittings can still be exploited, provided that they are larger than the homogeneous ('refocusable') line-width $1/(\pi T_2')$. In amino acids, the time constant $T_2'(^{13}C^\alpha)$ of spin-echo decays can be as long as 50 ms, so that $1/(\pi T_2')=6$ Hz is not exceptional for $^{13}C^\alpha$.

Figure 1:
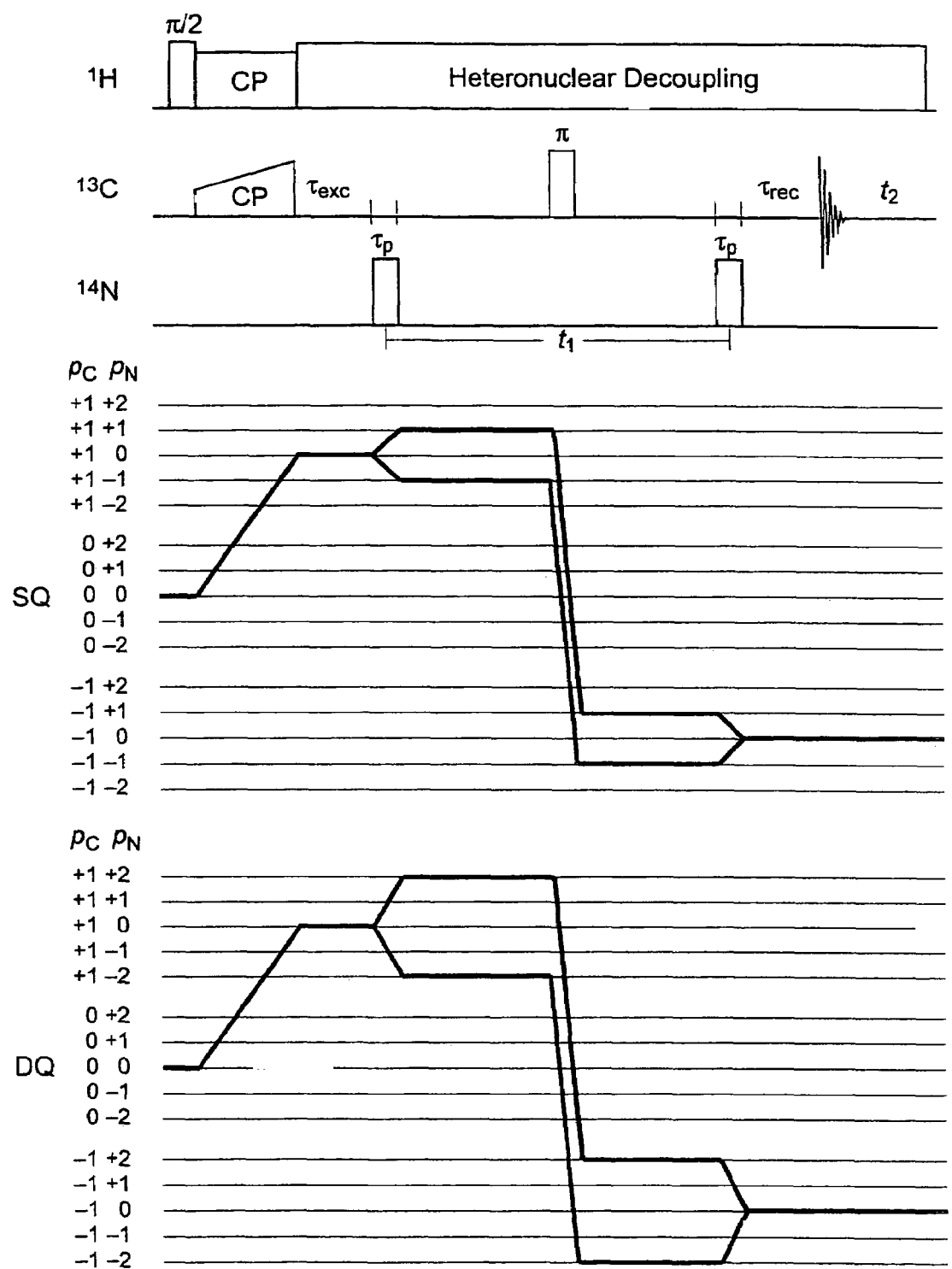
FIG. 1 shows a pulse sequence and coherence transfer pathways for the excitation of $^{14}$N single- or double-quantum coherences according to the invention.

The pulse sequence and coherence transfer pathways for the novel two-dimensional correlation NMR methods are illustrated in FIG. 1. After exciting carbon-13 single-quantum coherence $C_x=(T^C_{11}+T^C_{1-1})/2$ in the usual manner by cross-polarization from protons, a delay $\tau \approx \frac{1}{2}D$ leads to a state that can be described by a product of irreducible tensor operators $T^C_{11}T^N_{20}$. This state can also be represented by a product of Cartesian operators $C_x(N_z^2-2E_N/3)$, where the unity operator $E_N$ ensures that the product operator is traceless and orthonormal. For simplicity, we can loosely speak of a doubly-antiphase operator $C_xN_z^2$. However, it turns out that irreducible tensor operators are more convenient to describe heteronuclear multiple-quantum coherences. A radio-frequency pulse applied in the center of the $^{14}N$ spectrum can lead to a partial conversion into $T^C_{11}T^N_{1\pm 1}$ and $T^C_{11}T^N_{2\pm 1}$ (corresponding to $^{14}N$ single-quantum coherences) or into $T^C_{11}T^N_{2\pm 2}$, corresponding to $^{14}N$ double-quantum coherences. Henceforth, we shall speak of nitrogen-14 single-uantum (SQ) or double-quantum (DQ) spectroscopy, which are distinct in their coherence transfer pathways (FIG. 1), and of course in the appearance of the spectra. In either case, a $\pi$ pulse applied to $^{13}C$ in the middle of the evolution interval $t_1$ not only interconverts $T^C_{1+1}$ and $T^C_{1-1}$ to refocus the carbon chemical shifts, but also eliminates the effects of inhomogeneous decay, so that the attenuation of the signal by irreversible dephasing of the carbon-13 coherences is determined by the factor $\exp\{-(\tau_{exc}+t_1+\tau_{rec})/T_2'(C)\}$. Terms containing $T^C_{1-1}$ are converted into $T^C_{1+1}$ by the $\pi$ pulse at $t_1/2$ and therefore cannot contribute to any observable pathways, unless a z-filter is inserted prior to signal observation. Note that in the fixed intervals $\tau_{exc}$ and $\tau_{rec}$, the inhomogeneous decay with a time constant $T_2^* \ll T_2'$ does not contribute to signal losses.

The heteronuclear coherences $T^C_{11}T^N_{1\pm 1}$ and $T^C_{11}T^N_{2\pm 1}$ or $T^C_{11}T^N_{2\pm 2}$ are allowed to evolve freely during the evolution interval $t_1$ prior to symmetrical reconversion into observable single quantum coherence $T^C_{1-1}$. The experiment is repeated for N rotor-synchronized increments $t_1=n\Delta t_1$ with $\Delta t_1=1/v_{rot}$ and $n=1, 2, 3, \ldots, N$, in the manner of two-dimensional spectroscopy. The time-domain signals $S(t_1,t_2)$ are Fourier transformed with respect to $t_1$ to yield a $^{14}N$ spectrum in the $\omega_1$ domain, and with respect to $t_2$ to produce a $^{13}C$ spectrum in the $\omega_2$ domain. The coherence transfer pathways in FIG. 1 show that both single- and double quantum experiments lead to pure two-dimensional absorption line shapes since they retain two mirror-image pathways with respect to the $^{14}N$ coherence order $\rho_N$. Note that, in contrast to most other 2D experiments, the $t_1$ period is defined as the interval between the centers of the two $^{14}N$ pulses, rather than as a period of free precession. Its initial duration corresponds to one rotor period, so that a first-order phase correction must be applied to the $\omega_1$ domain. The initial free evolution interval between the pulses is $1/v_{rot}-\tau_p$.

The nitrogen-14 single- and double-quantum coherences evolve in the $t_1$ interval under the effect of the quadrupolar interaction and the chemical shift. The single-quantum coherences are affected by both first- and second-order quadrupole interactions, while the double-quantum coherences are affected only by second-order quadrupole effects. Synchronization of the increments $\Delta t_1$ with the spinner period $1/v_{rot}$ leads to aliasing in the $\omega_1$ domain, so that the spinning sidebands coincide with the center bands. The spinning sidebands can be observed separately if smaller time increments are chosen.

Many variants of the experiments can be conceived. For example, optional $(\pi/2)_\phi$ pulses applied to $^{13}C$ at the beginning and at the end of the evolution period can convert $T^S_{11}T^I_{22}$ into $T^S_{10}T^I_{22}$ and back. Complementary experiments with different phases $\phi$ of the $^{13}C$ pulse can be used. This variant allows one to avoid the $T_2$-decay of the $T^S_{11}$ term in the $t_1$ interval. Another variant uses a z-filter before the detection period so that the excitation and reconversion are symmetrical even when there is a distribution of residual dipolar splittings. This improves the spectra if $\tau_{rec} < \frac{1}{2}D$, so that the reconversion into in-phase $C_x$ coherence is not complete.

Figure 2:
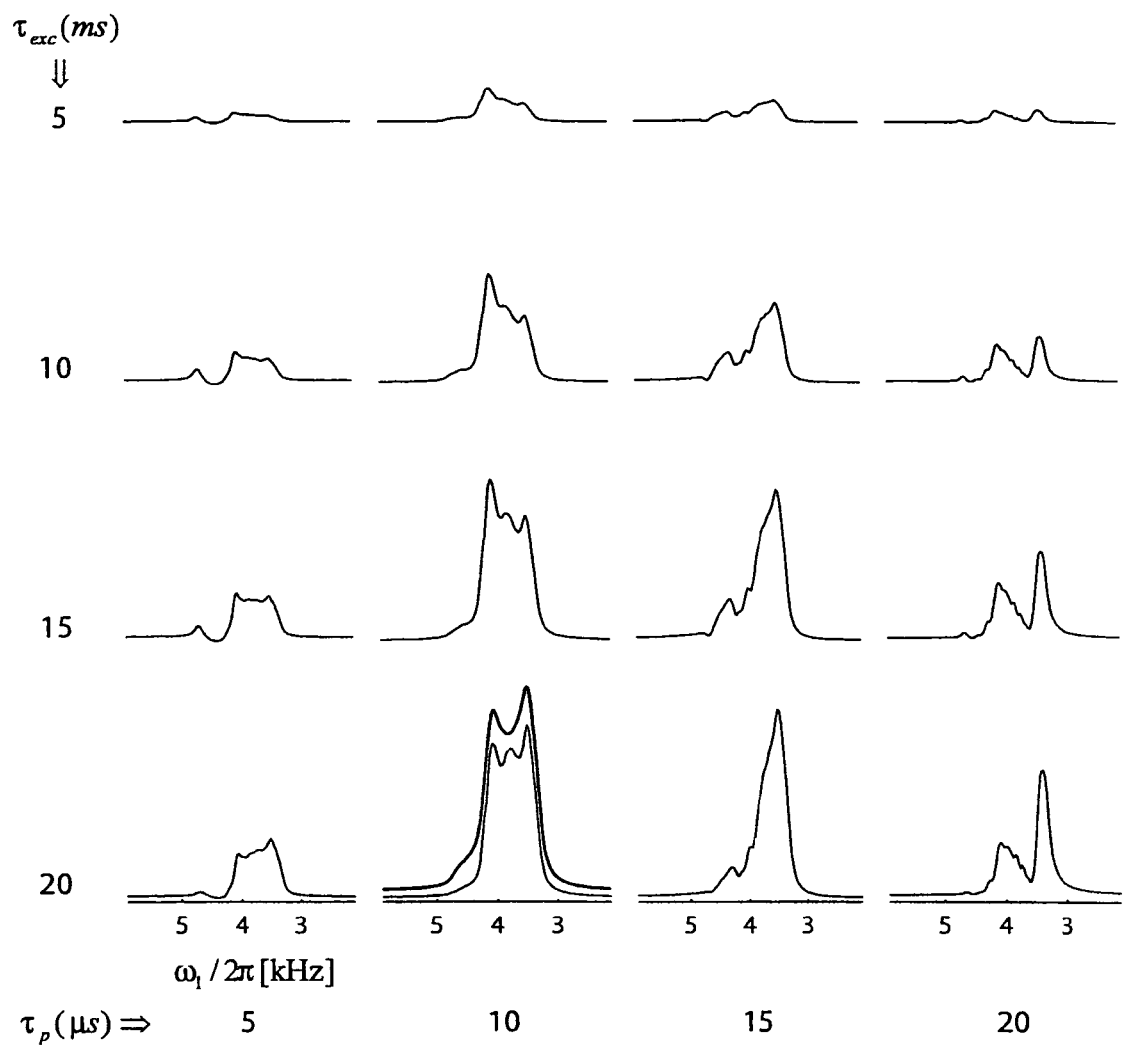
FIG. 2 shows simulations of $^{14}$N single-quantum (SQ) powder patterns that result from the pulse sequence of FIG. 1 for different excitation intervals and $^{14}$N pulse lengths.
Figure 3:
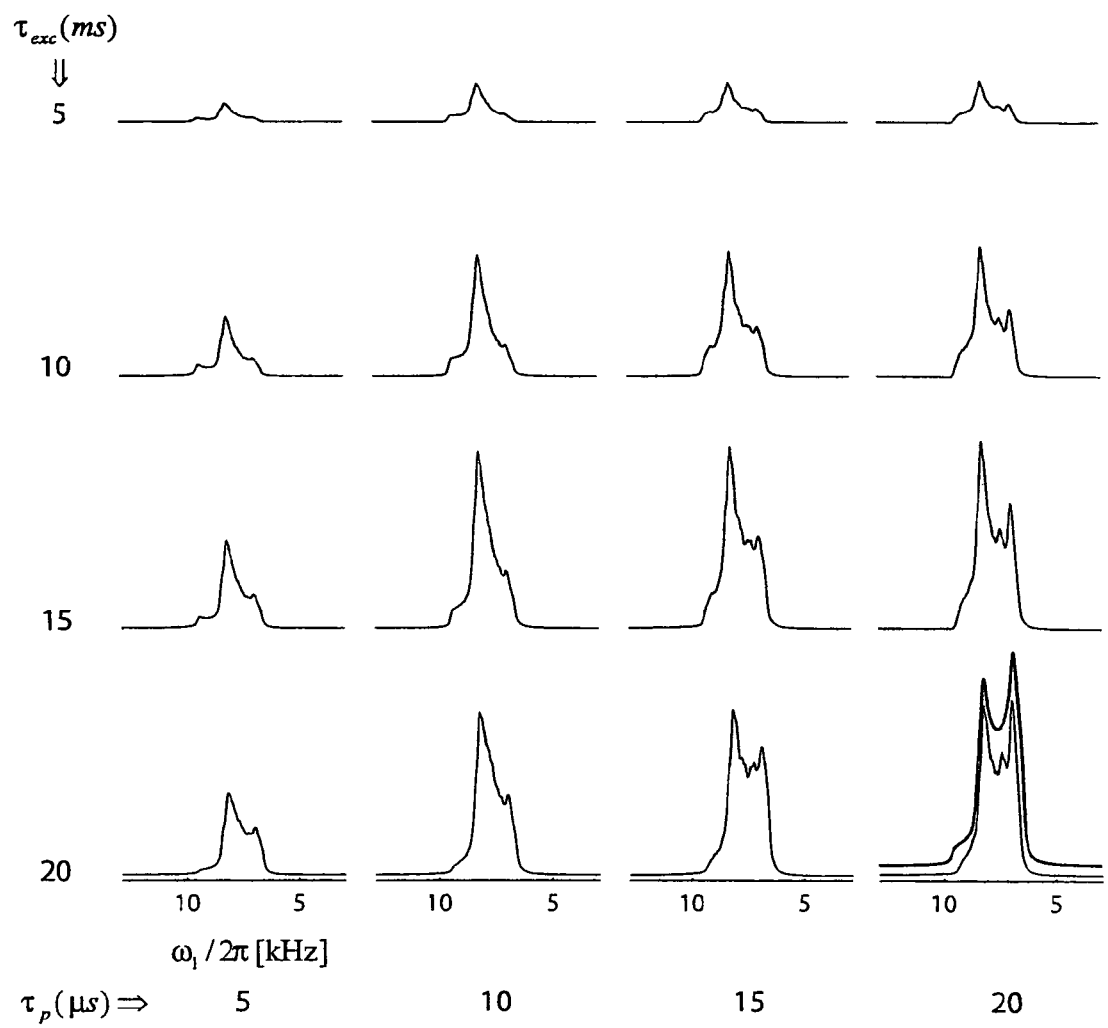
FIG. 3 shows simulations of $^{14}$N double-quantum (DQ) powder patterns with the same parameters as in FIG. 2.

FIG. 2 and FIG. 3 show simulations of SQ and DQ powder patterns as a function of the excitation and reconversion intervals $\tau_{exc}=\tau_{rec}$ and of the $^{14}N$ pulse length $\tau_p$. The thick lines show the spectra expected for ideal single- and double-quantum excitation. For quadrupole parameters that are typical for amino acids, the optimum $\tau_p$ for SQ excitation is about half as for DQ excitation.

Figure 4:
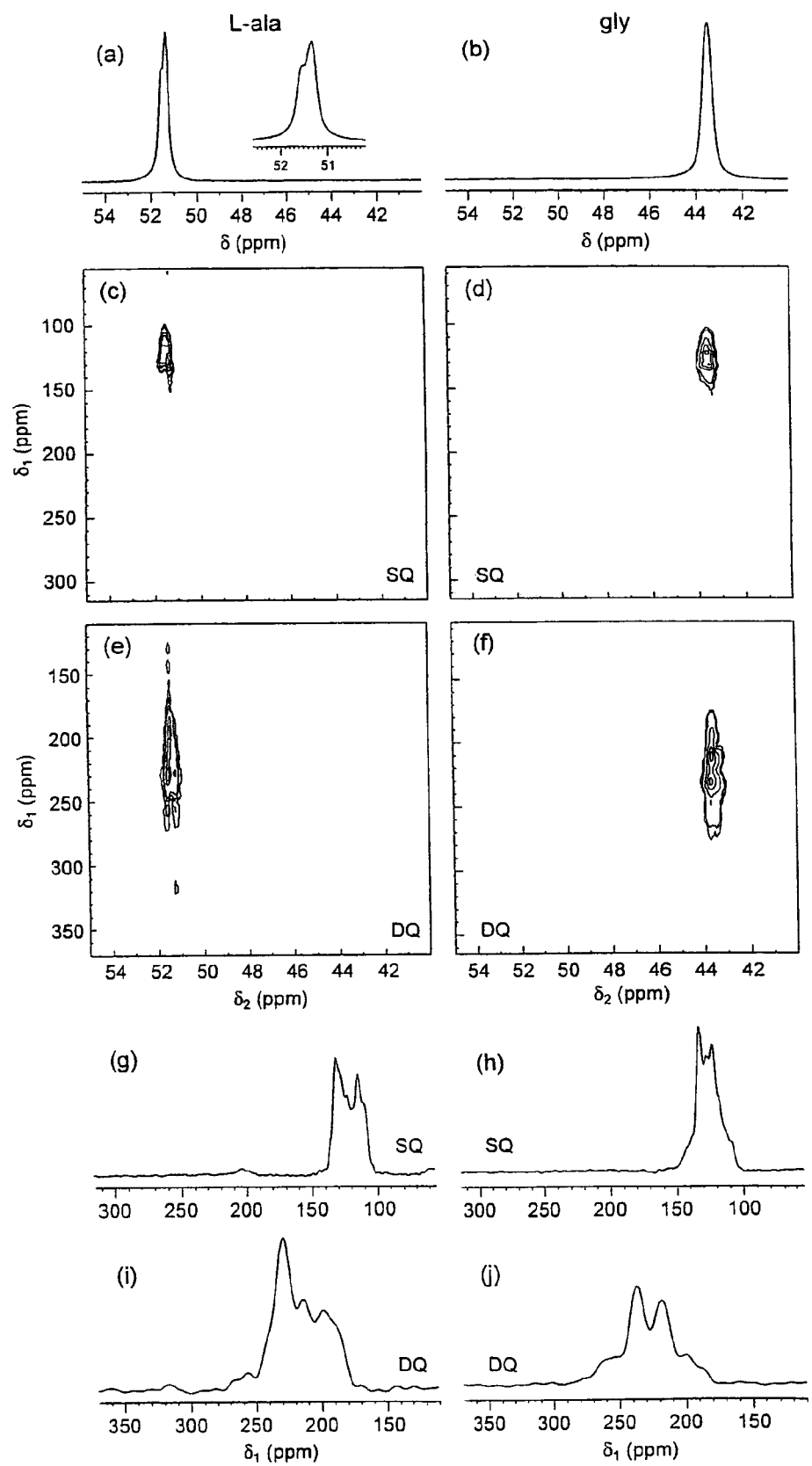
FIG. 4a shows an experimental $^{13}$C CPMAS in L-alanine.
FIG. 4b shows an experimental $^{13}$C CPMAS in glycine.
FIG. 4c shows a 2-dimensional $^{14}$N/$^{13}$C correlation spectrum in L-alanine with single-quantum signals.
FIG. 4d shows a 2-dimensional $^{14}$N/$^{13}$C correlation spectrum in glycine with single-quantum signals.
FIG. 4e shows a 2-dimensional $^{14}$N/$^{13}$C correlation spectrum in L-alanine with double-quantum signals
FIG. 4f shows a 2-dimensional $^{14}$N/$^{13}$C correlation spectrum in glycine with double-quantum signals
FIG. 4g-j shows projections of the $^{14}$N single- and double-quantum coherences of FIG. 4c-f onto the $\delta_1$ axis.

In the experimental SQ and DQ spectra of FIG. 4, the $^{14}N$ patterns have line-widths on the order of a few kHz, determined by the anisotropy of the second order quadrupole interaction. The SQ spectra are about twice as narrow at the DQ spectra. For L-alanine in FIG. 4a, the residual dipolar splitting $D(^{14}N, ^{13}C)$ is barely resolved at 9.4 T. The fact that $^{14}N$ coherences can be excited efficiently even in the absence of a resolved residual dipolar splitting is demonstrated in FIG. 4b for glycine.

Figure 5:
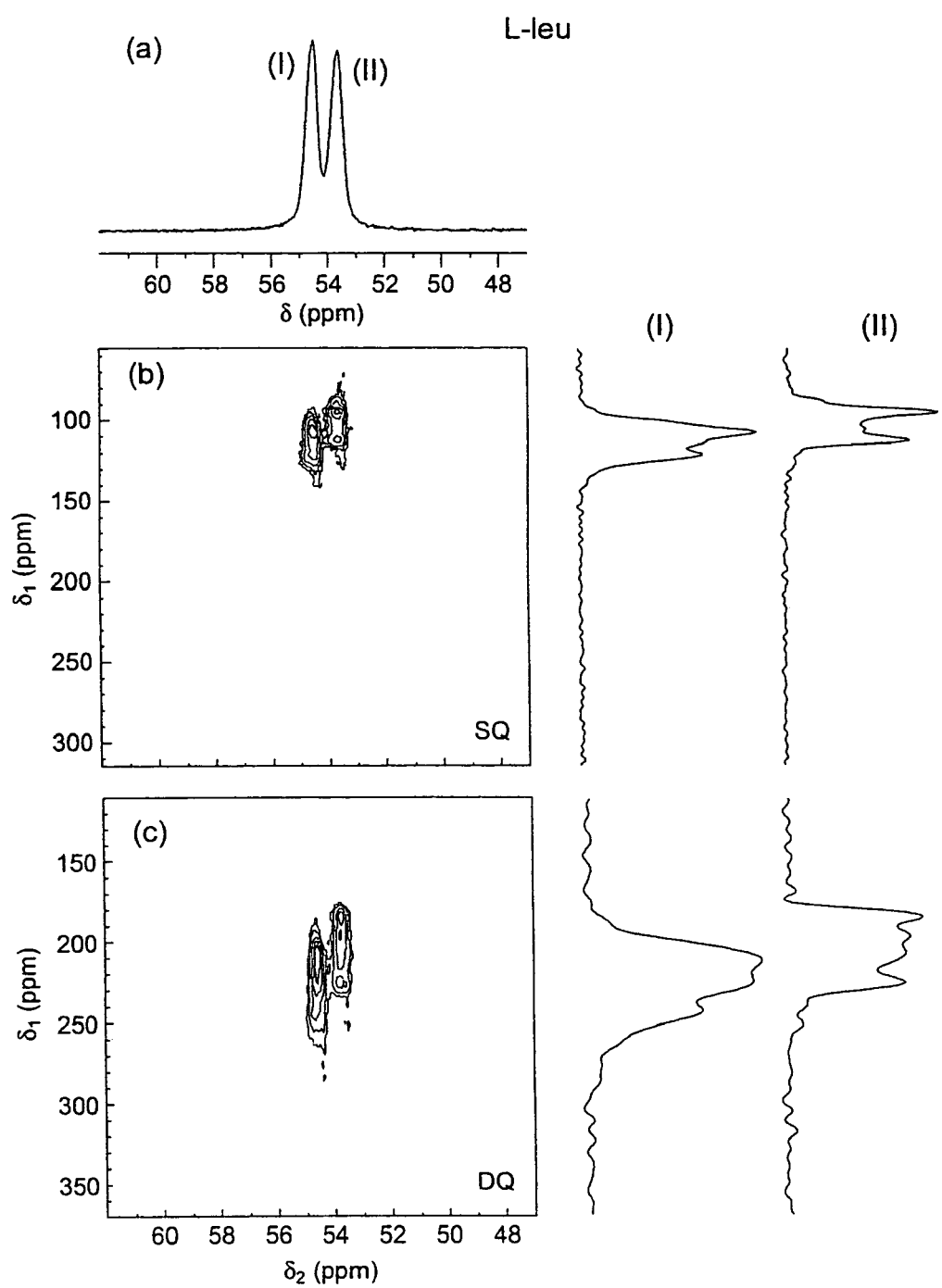
FIG. 5a shows an experimental $^{13}$C CPMAS of L-leucine.
FIG. 5b shows a two-dimensional $^{14}$N/$^{13}$C correlation spectra obtained with single-quantum methods of L-leucine.
FIG. 5c shows a two-dimensional $^{14}$N/$^{13}$C correlation spectra obtained with double-quantum methods of L-leucine.

FIG. 5 shows how the two crystallographic ally inequivalent $^{13}C$ sites I and II in powdered L-leucine correlate with non-degenerate $^{14}N$ quadrupole parameters estimated to $C_Q^I=1.2$ MHz, $\eta_Q^I=0.3$, $C_Q^{II}=1.1$ MHz, $\eta_Q^{II}=0.1$. Again, the SQ spectra are about twice as narrow at the DQ spectra.

Figure 6:
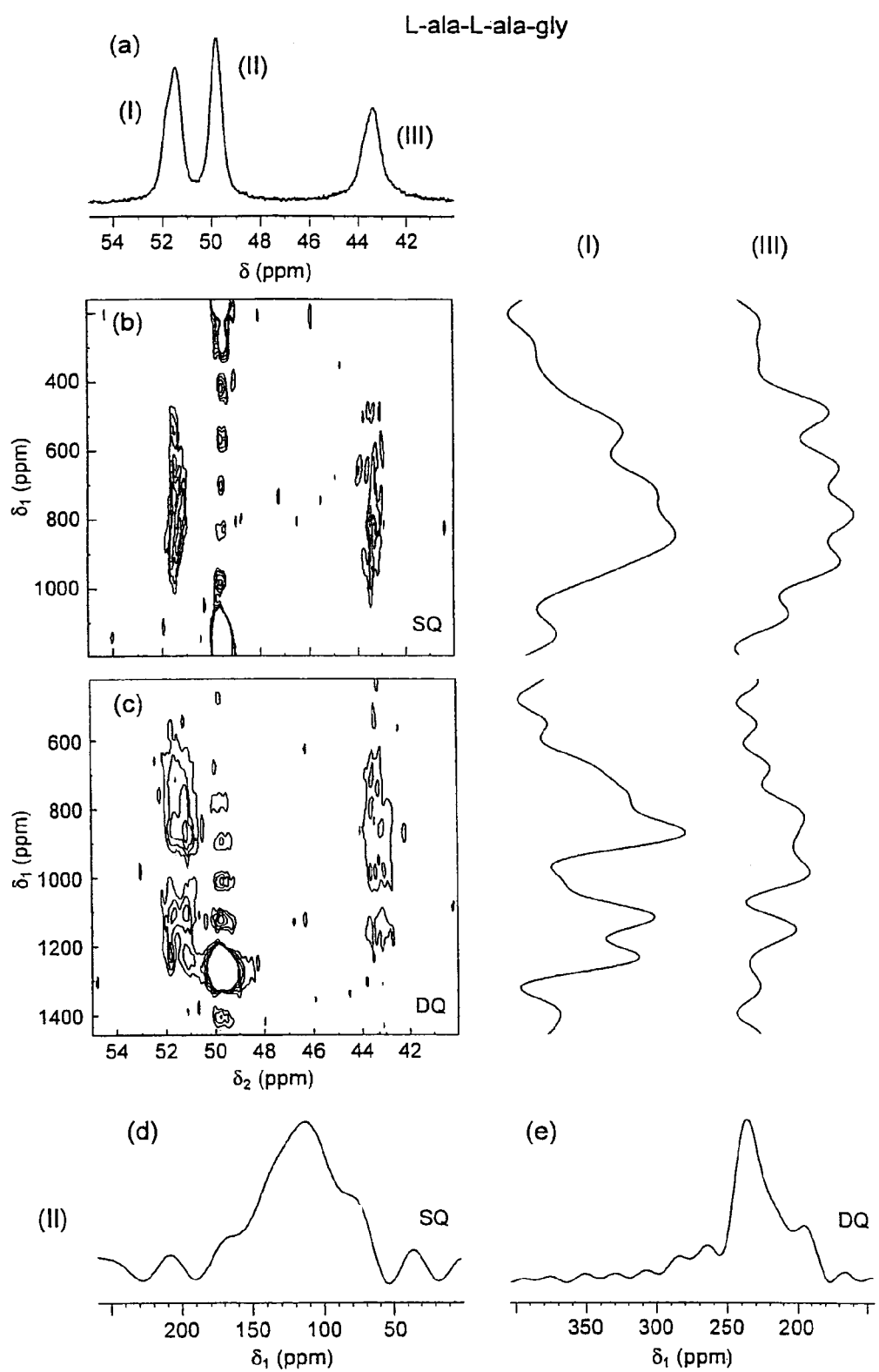
FIG. 6a shows an experimental $^{13}$C CPMAS for the tripeptide L-ala-L-ala-gly.
FIG. 6b shows a two-dimensional $^{14}$N/$^{13}$C correlation spectra obtained with single-quantum methods for the tripeptide L-ala-L-ala-gly.
FIG. 6c shows a two-dimensional $^{14}$N/$^{13}$C correlation spectra obtained with double-quantum methods for the tripeptide L-ala-L-ala-gly.

FIG. 6 shows a challenging example of a tripeptide L-ala-L-ala-gly. The terminal $^{14}NH_3^+$ group (site II) has similar parameters as in FIG. 4, except that is this case the SQ spectrum is broader than the DQ spectrum, which indicates motional broadening.[41] On the other hand, the amide groups $-CO^{14\ NH13}C^\alpha-$ have quadrupole parameters $C_Q^I$ and $C_Q^{III}$ of at least 3 MHz. It is remarkable that signals could be excited and observed with a $^{14}N$ RF strength of only 60 kHz for such large quadrupole interactions.

The sensitivity is largely determined by the quantum yield of two-way coherence transfer. The efficiency of the conversion of $T^C_{11}T^N_{20}$ into $T^C_{11}T^N_{2\pm 1}$ or $T^C_{11}T^N_{2\pm 2}$ and back under MAS is determined by the amplitude $\omega_1^N$ N and duration $\tau_p$ of the $^{14}N$ pulse. Numerical calculations (neglecting relaxation) with integration over all crystallite orientations show that with $C_Q=1.2$ MHz, $\eta_Q=0$, $v_{RF}^N=60$ kHz, $\tau_p=15$ μs, $D=30$ Hz, and $\tau_{exc}=\tau_{rec}=15$ ms, the efficiency of the two-way coherence transfer to SQ or DQ and back is about 5%. Experiments indicate an efficiency of 2% for SQ or DQ spectra for the first $t_1$ increment, compared with a simple $^{13}C$ CPMAS spectrum.

The experiments work in principle with $^{13}C$ in natural abundance. The sensitivity can be boosted by a factor of about 100 by $^{13}C$ enrichment, as we have done to optimize the experimental conditions. In principle, the experiment can work with any S=½ "spy" nucleus such as phosphorus-31, nitrogen-15, silicon-29, etc., provided that there is a non-vanishing residual dipolar splitting and/or scalar coupling between the spy nucleus and $^{14}$N. In some cases, the J coupling may be larger than D. Even protons could be used as spy nuclei, provided the broadening due to homonuclear dipolar proton-proton couplings does not mask the residual dipolar splittings. It is possible to contemplate the indirect detection of other quadrupolar nuclei with S=3/2, 5/2 etc., such as $^{35}$Cl, $^{17}$O, etc., provided that one can exploit a residual dipolar splitting with suitable spy nuclei.

Figure 7:
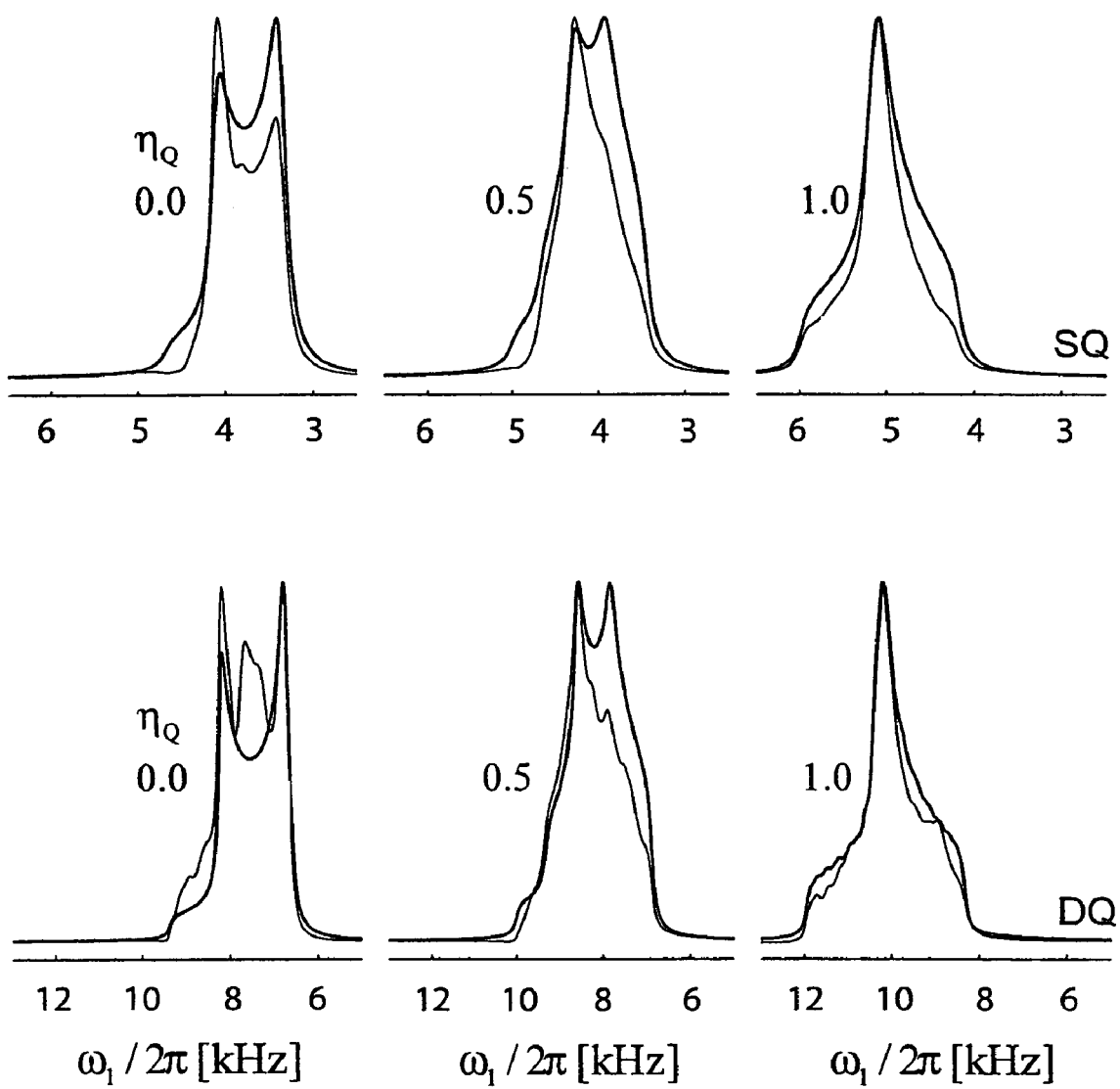
FIG. 7 shows simulations of single-quantum and double-quantum $^{14}$N spectra.
Figure 8:
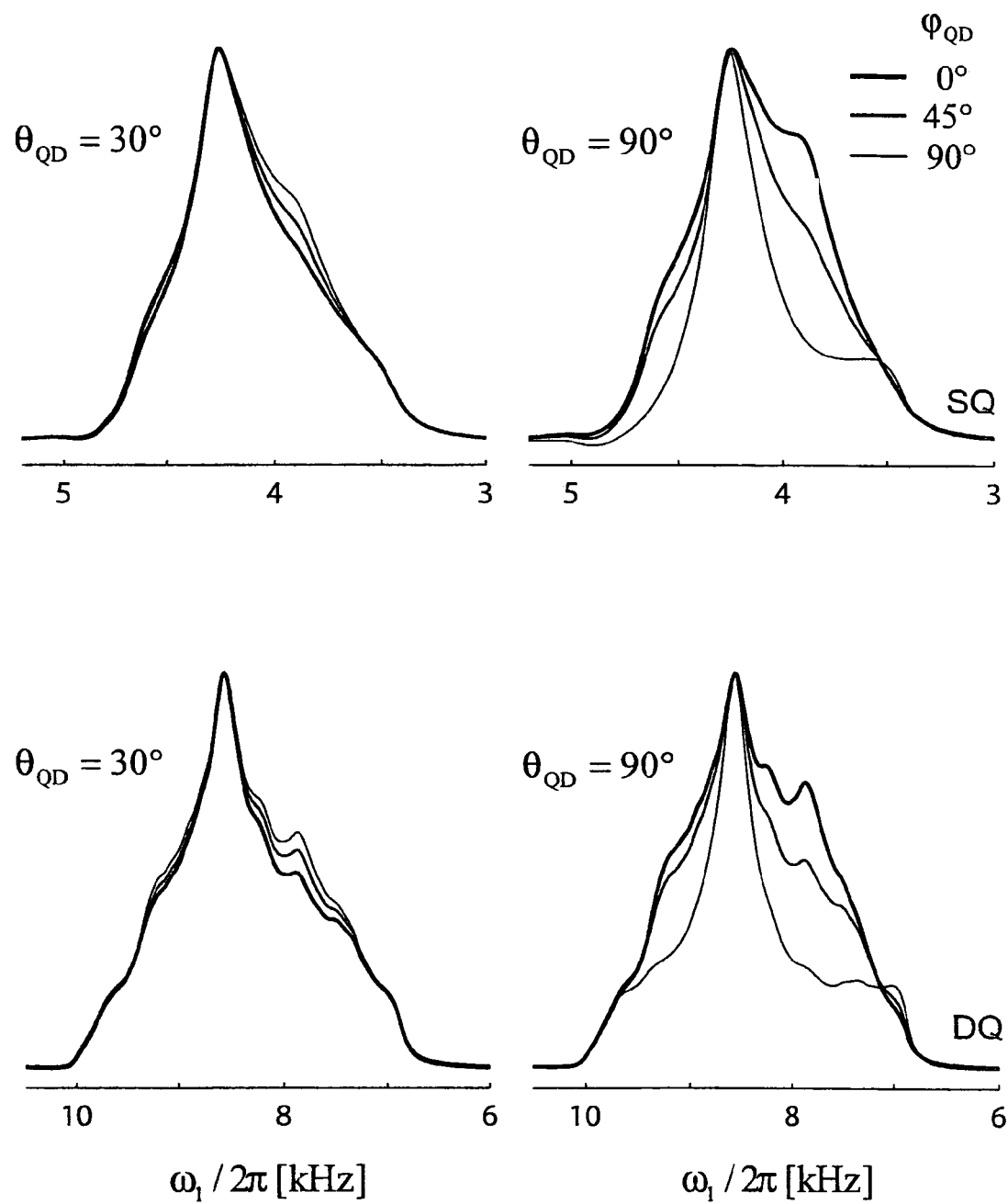
FIG. 8 shows simulations of single-quantum and double-quantum $^{14}$N spectra at different polar angles.

FIG. 7 and FIG. 8 show how the line shapes depend on the quadrupole asymmetry parameter $\eta_Q$ and on the relative orientation $\theta_{QD}$, $\phi_{QD}$ of the internuclear nitrogen-carbon vector with respect to the principal axis system of the quadrupole tensor. It is possible to determine these parameters by analysis of the line-shapes. Indeed, the efficiency of the $^{14}$N single- or double-quantum excitation (and hence the line-shapes) depends on the magnitude of the quadrupole tensor and on its relative orientation with respect to the $^{13}$C-$^{14}$N dipole-dipole interaction.

The samples were packed in 2.5 mm outer diameter ZrO$_2$ rotors (sample volume ca. 11 μl), and spun at 30 kHz in a Bruker triple resonance CP-MAS probe where one channel was adapted for nitrogen-14 resonance, using the 9.4 T wide-bore magnet ($^{13}$C and $^{14}$N Larmor frequencies of 100.6 and 28.9 MHz) of an Advance 400 spectrometer. The magic angle was adjusted within 0.004°.[38] Cross-polarization (CP) was used with a constant proton RF amplitude $v_{RF}^H$=85 kHz while $v_{RF}^C$ was ramped. Two-pulse phase-modulation (TPPM) proton decoupling was used during the entire experiment with an RF amplitude 100 kHz, pulse-widths of 3.9 μs, and a phase difference between two successive pulses of 35°. The RF amplitude of the $^{14}$N pulses was calibrated by direct detection of $^{14}$NH$_4$NO$_3$, which has a very small quadrupole splitting. The $^{14}$N pulses had an amplitude of $v_{RF}^N$=60 kHz using a 500 W amplifier. The samples of L-alanine ($^{14}$NH$_4^+$$^{13}$C$^\alpha$HCH$_3$COO$^-$), glycine ($^{14}$NH$_4^+$$^{13}$C$^\alpha$H$_2$COO$^-$), L-leucine ($^{14}$NH$_4^+$$^{13}$C$^\alpha$HRCOO$^-$) with R=CH$_2$CH(CH$_3$)$_2$ and the tri-peptide L-ala-L-ala-gly, all enriched in the $^{13}$C$^\alpha$ positions, were purchased from Cambridge Isotope Laboratories, and used without further purification.

FIG. 1 shows pulse sequence and coherence transfer pathways for the excitation of $^{14}$N single- or double-quantum coherences in two-dimensional correlation experiments for solids rotating at the magic angle. The sequence starts with cross-polarization from protons to carbon-13 to generate $C_X$ magnetization, followed by an interval $\tau_{exc}\approx\frac{1}{2}D$ where the residual dipolar splitting D and the scalar coupling J between $^{14}$N and $^{13}$C lead to anti-phase coherences $T^C_{11}T^N_{10}$ and $T^C_{11}T^N_{20}$. In the $^{14}$N single-quantum experiment (SQ), these are converted into heteronuclear coherences $T^C_{11}T^N_{11}$ and $T^C_{11}T^N_{21}$ by applying an RF pulse of duration $\tau_p$ to the $^{14}$N nuclei, while in the $^{14}$N double-quantum experiment (DQ), one excites heteronuclear coherences $T^C_{11}T^N_{22}$. The evolution period $t_1$ is defined as the separation between the centers of the two RF pulses applied to the $^{14}$N nuclei, with a duration $t_1=nt_{rot}$(n=1, 2, ... N). In this interval, the coherences evolve chiefly under the second-order quadrupole interaction, before being converted back into observable $C_X$ magnetization. The coherence transfer pathway diagrams show that pure two-dimensional line shapes are obtained. The SQ experiment uses a simple phase alternation of the first $^{14}$N pulse with addition and subtraction of the $^{13}$C signals, while the DQ experiments requires a 4-step cycle of the phase of the first $^{14}$N pulse (0, 90, 180, 270°), again with addition and subtraction of the $^{13}$C signals. In addition, the first $^1$H pulse may be phase-alternated, and the $^{13}$C π pulse may be exorcycled.

FIG. 2 shows simulations of $^{14}$N single-quantum (SQ) powder patterns that result from the pulse sequence of FIG. 1 for different excitation intervals $\tau_{exc}$ and $^{14}$N pulse lengths $\tau_p$. The radio-frequency (RF) field amplitude is $v_{RF}$=60 kHz, the quadrupolar parameters are $C_Q$=1.2 MHz and $\eta_Q$=0.2, the dipolar interaction corresponds to a typical $^{14}$N-$^{13}$C bond length ($d_{CN}$=667 Hz) leading to a residual dipolar splitting D≈25 Hz at 9.4 T. The powder pattern drawn with a thick line represents the ideal line-shape of the single-quantum $^{14}$N MAS spectrum obtained with ideal excitation and rotor synchronized acquisition.

FIG. 3 shows simulations of $^{14}$N double-quantum (DQ) powder patterns with the same parameters as in FIG. 2. The powder pattern drawn with a thick line represents the ideal line shape for the double-quantum $^{14}$N MAS spectrum obtained with ideal excitation and rotor synchronized acquisition.

FIG. 4 shows (a, b) experimental $^{13}$C CPMAS and two-dimensional $^{14}$N/$^{13}$C correlation spectra showing isotropic $^{13}$C chemical shifts along the horizontal $\omega_2$ axis ($\delta_2$ labeled in ppm with respect to TMS) and $^{14}$N (c, d) single- and (e, f) double-quantum signals along the vertical $\omega_1$ axis ($\delta_1$ labeled in ppm with respect to $^{14}$NH$_4$NO$_3$). (a) In L-alanine ($^{14}$NH$_4^+$$^{13}$C$^\alpha$HCH$_3$COO$^-$) the $^{13}$C CPMAS spectrum reveals an ill-resolved residual dipolar splitting (see expansion); (b) in glycine ($^{14}$NH$_4^+$$^{13}$C$^\alpha$H$_2$COO$^-$) there is no visible residual dipolar splitting. Nevertheless, the $^{14}$N single- and double-quantum coherences can be excited efficiently and the projections onto the $\delta_1$ axis (g-j) reveal characteristic second-order quadrupolar powder patterns. For L-alanine $C_Q$≈1.2 MHz and $\eta_Q$≈0.3; for glycine $C_Q$≈1.2 MHz and $\eta_Q$≈0.5. Under our experimental conditions the $T_2'(^{13}$C$^\alpha)$ values are found to be 28 and 23 ms for L-alanine and glycine, respectively. The CPMAS spectra (a, b) result from averaging 8 transients with relaxation intervals of 5 s. The two-dimensional spectra result from averaging (c, d) 32 and (e, f) 96 transients for each of (c, d) 512 and (e, f) 170 $t_1$ increments $\Delta t_1$=1/$v_{rot}$=33.33 μs, with a relaxation interval of 3 s. The intervals $\tau_{exc}=\tau_{rec}$ were 16 ms, while $\tau_p$ was (c, d) 11 μs and (e, f) 15 μs. The CP contact times for L-ala and gly were 0.5 and 1 ms, respectively.

FIG. 5 shows (a) experimental $^{13}$C CPMAS and two-dimensional $^{14}$N/$^{13}$C correlation spectra obtained with (b) single- and (c) double-quantum methods of L-leucine that has two magnetically inequivalent sites I and II for $^{14}$N and $^{13}$C$^\alpha$. The projections onto the $\delta_1$ axis (right) reveal second-order quadrupolar powder patterns that resembles simulated patterns with $C_Q^I$≈1.2 MHz, $C_Q^{II}$≈1.1 MHz, $\eta_Q^I$≈0.3, and $\eta_Q^{II}$≈0.1. The $T_2'$ values of the two $^{13}$C$^\alpha$ sites in L-leu are found to be (I) 26 and (II) 22 ms. The CPMAS spectrum (a) results from averaging 8 transients with a relaxation interval of 5 s. The two-dimensional spectra result from averaging (b) 32 and (c) 96 transients for each of (b) 400 and (c) 190 $t_1$ increments of $\Delta_{t1}$=1/$v_{rot}$=33.33 μs, with a relaxation interval of 3 s. The intervals $\tau_{exc}=\tau_{rec}$ were 16 ms, while $\tau_p$ was (b) 11 μs and (c) 23 μs. The CP contact time was 0.6 ms.

FIG. 6 shows (a) experimental $^{13}$C CPMAS and two-dimensional $^{14}$N/$^{13}$C correlation spectra obtained with (b) single- and (c) double-quantum methods for the tripeptide L-ala-L-ala-gly where all $^{13}$C$^\alpha$ are enriched. For the amide sites (I) and (III), $^{14}$N SQ and DQ signals can be observed (projections on the right) despite very large first-order quadrupole couplings ($C_Q^I$≈$C_Q^{III}$≈3 MHz) and very short $T_2'$ ($^{13}$C$^\alpha$)=14, 11 and 8 ms for sites I, II and III respectively.

The projections of the $NH_3^+$ group of the first L-alanine onto the $\delta_1$ axis (d, e) reveal powder patterns that correspond to $C_Q^H \approx 1.3$ MHz, and $\eta_Q^H \approx 0.3$. The line widths of all three sites in the SQ spectrum are broadened, most probably by local molecular motions. The CPMAS spectrum (a) results from averaging 8 transients with a relaxation interval of 5 s. The two-dimensional spectra result from averaging (b) 4096 and (c) 8192 transients for each of (b) 16 and (c) 20 $t_1$ increments $\Delta t_1 = 1\nu_{rot} = 33.33$ μs, with a relaxation interval of 2.5 s. The intervals $\tau_{exc} = \tau_{rec}$ were 6 ms, while $\tau_p$ was (b) 11 μs and (c) 24 μs. The CP contact time was 0.5 ms. The projections of the N-terminal $^{14}N$ resonances onto $\delta_1$ axis (d, e) were extracted from two-dimensional spectra recorded with (d) 64 (e) 96 $t_1$ increments each with (d) 128 and (e) 1024 transients.

FIG. 7 shows simulations of SQ and DQ $^{14}N$ spectra for $C_Q=1.2$ MHz and $\eta_Q=0$, 0.5 and 1, appropriate for $B_0=9.4$ T, $\tau_{exc}=15$ ms, $\nu_{RF}^N=60$ kHz, $\nu_{rot}=30$ kHz, $\tau_p=10$ μs for SQ and $\tau_p=20$ μs for DQ. The powder patterns drawn with thick lines represent spectra assuming ideal single- or double-quantum excitation and rotor synchronized acquisition.

FIG. 8 shows simulations of SQ and DQ $^{14}N$ spectra for $C_Q=1.2$ MHz and $\eta=0.5$, appropriate for $B_0=9.4$ T, $\tau_{exc}=15$ ms, $\nu_{RF}^N=60$ kHz, $\nu_{rot}=30$ kHz, $\tau_p=10$ μs for SQ and $\tau_p=20$ μs for DQ, as a function of the polar angles $\theta_{QD}$, $\phi_{QD}$ of the internuclear vector $r(^{14}N, ^{13}C)$ with respect to the principal axis system of the quadrupole tensor. For larger values of $\theta_{QD}$, the sensitivity of the line shapes to $\phi_{QD}$ is more pronounced.

To summarize, we have shown that by transferring coherence between $^{14}N$ and $^{13}C$ in solid powdered samples, one can indirectly detect the single- or double-quantum transitions of $^{14}N$ nuclei. Under fast magic-angle spinning, the spectra are determined predominantly by second-order quadrupole interactions. The orientation of the principal components of the quadrupole tensor can be readily rationalized in terms of electronic charge distributions. In many respects, quadrupole tensors are more straightforward to relate to the local environment than chemical shift tensors.[42] Quadrupole tensors can give direct insight into the electronic charge distribution in molecules. For example, the extent of "pyramidalisation" of nitrogen atoms in peptide bonds would be much easier to assess if one could determine nitrogen-14 quadrupole tensors instead of nitrogen-15 chemical shift tensors. Nitrogen-14 NMR could become an important tool for biology, chemistry and material science. The new method bears a close analogy to earlier work on the indirect detection of nitrogen-15 NMR,[43] which was originally published without a catchy name, but later dubbed Heteronuclear Single Quantum Correlation (HSQC).

REFERENCES

[1] J. Mason, in *"Encyclopaedia of Nuclear Magnetic Resonance"*, edited by D. M. Grant and R. K. Harris (Wiley, Chichester, 1996), Vol. 5, p. 3222.

[2] R. Blinc, M. Mali, R. Osredkar, A. Prelesnik, J. Seliger, I. Zupancic, L. Ehrenberg, *J. Chem. Phys.* 1972, 57, 5087.

[3] D. T. Edmonds, C. P. Summers, *Journal of Magnetic Resonance* 1973, 12, 134.

[4] R. E. Stark, R. A. Haberkorn, R. G. Griffin, *J. Chem. Phys.* 1978, 68, 1996.

[5] R. A. Haberkorn, R. E. Stark, H. Van Willigen, R. G. Griffin, *J. Am. Chem. Soc.* 1981, 103, 2534.

[6] C. A. McDowell, A. Naito, D. L. Sastry, K. Takegoshi, *Journal of Magnetic Resonance* 1986, 69, 283.

[7] A. Naito, S. Ganapathy, P. Raghunathan, C. A. McDowell, *J. Chem. Phys.* 1983, 79, 4173.

[8] A. Naito, C. A. McDowell, *J. Chem. Phys.* 1984, 81, 4795.

[9] K. Ermolaev, B. M. Fung, *J. Chem. Phys.* 1999, 110, 7977.

[10] A. K. Khitrin, B. M. Fung, *J. Chem. Phys.* 1999, 111, 8963.

[11] H. J. Jakobsen, H. Bildsoe, J. Skibsted, T. Giavani, *J. Am. Chem. Soc.* 2001, 123, 5098.

[12] T. Giavani, H. Bildsoe, J. Skibsted, H. J. Jakobsen, *J. Phys. Chem. B* 2002, 106, 3026.

[13] T. Giavani, H. Bildsoe, J. Skibsted, J. Jakobsen Hans, *Journal of Magnetic Resonance* 2004, 166, 262.

[14] A. Pines, D. J. Ruben, S. Vega, M. Mehring, *Phys. Rev. Lett.* 1976, 36, 110.

[15] P. Brunner, M. Reinhold, R. R. Ernst, *J. Chem. Phys.* 1980, 73, 1086.

[16] M. Reinhold, P. Brunner, R. R. Ernst, *J. Chem. Phys.* 1981, 74, 184.

[17] T. K. Pratum, M. P. Klein, *Journal of Magnetic Resonance* 1983, 55, 421.

[18] M. Bloom, M. A. LeGros, *Can. J. Phys.* 1986, 64, 1522.

[19] R. Tycko, P. L. Stewart, S. J. Opella, *J. Am. Chem. Soc.* 1986, 108, 5419.

[20] R. Tycko, S. J. Opella, *J. Am. Chem. Soc.* 1986, 108, 3531.

[21] R. Tycko, S. J. Opella, *J. Chem. Phys.* 1987, 86, 1761.

[22] R. Tycko, in *"Encyclopedia of Nuclear Magnetic Resonance"*, edited by D. M. Grant and R. K. Harrs (Wiley, Chichester, 1996), Vol. 5, p. 3425.

[23] A. Llor, J. Virlet, *Chem. Phys. Lett.* 1988, 152, 248.

[24] A. Samoson, E. Lippmaa, A. Pines, *Mol. Phys.* 1988, 65, 1013.

[25] K. T. Mueller, B. Q. Sun, G. C. Chingas, J. W. Zwanziger, T. Terao, A. Pines, *Journal of Magnetic Resonance* 1990, 86, 470.

[26] K. Takegoshi, K. Hikichi, *Chem. Phys. Lett.* 1992, 194, 359.

[27] L. Marinelli, S. Wi, L. Frydman, *J. Chem. Phys.* 1999, 110, 3100.

[28] C. P. Grey, W. S. Veeman, *Chem. Phys. Lett.* 1992, 192, 379.

[29] C. P. Grey, A. P. Eijkelenboom, W. S. Veeman, *Solid State Nucl. Magn. Reson.* 1995, 4, 113.

[30] C. P. Grey, A. J. Vega, *J. Am. Chem. Soc.* 1995, 117, 8232.

[31] S. Wi, L. Frydman, *J. Am. Chem. Soc.* 2001, 123, 10354.

[32] K. Takegoshi, T. Yano, K. Takeda, T. Terao, *J. Am. Chem. Soc.* 2001, 123, 10786.

[33] J. G. Hexem, M. H. Frey, S. J. Opella, *J. Am. Chem. Soc.* 1981, 103, 224.

[34] A. Naito, S. Ganapathy, C. A. McDowell, *J. Chem. Phys.* 1981, 74, 5393.

[35] R. K. Harris, A. C. Olivieri, *Prog. NMR Spectrosc.* 1992, 24, 435.

[36] C. A. McDowell, in *"Encyclopedia of Nuclear Magnetic Resonance"*, edited by D. M. Grant and R. K. Harrs (Wiley, Chichester, 1996), Vol. 5, p. 2901.

[37] V. F. Bystrov, *Prog. NMR Spectrosc.* 1976, 10, 41.

[38] S. Antonijevic, G. Bodenhausen, *Angew. Chem. Int Ed.* 2005, 44, 2935.

[39] A. E. Bennett, C. M. Rienstra, M. Auger, K. V. Lakshmi, R. G. Griffin, *J. Chem. Phys.* 1995, 103, 6951.

[40] G. De Paepe, B. Elena, L. Emsley, *J. Chem. Phys.* 2004, 121, 3165.

[41] S. E. Ashbrook, S. Antonijevic, A. J. Berry, S. Wimperis, *Chem. Phys. Lett.* 2002, 364, 634.

[42] C. Gervais, M. Profeta, V. Lafond, C. Bonhomme, T. Azais, H. Mutin, J. Pickard Chris, F. Mauri, F. Babonneau, *Magn. Reson. Chem.* 2004, 42, 445.

[43] G. Bodenhausen, D. J. Ruben, *Chem. Phys. Lett.* 1980, 69,185.

We claim:

1. A method for obtaining a two-dimensional NMR (=nuclear magnetic resonance) spectrum of quadrupolar nuclei of $^{14}$N having spin I=1 using magic angle spinning (=MAS) of a solid powder sample and transfer of coherence from a neighboring nucleus with spin S=½ to single- or double-quantum transitions of said quadrupolar nuclei of $^{14}$N having spin I=1, wherein the detection of the spectrum occurs indirectly via the spin S=½ nuclei, wherein the transfer of coherence occurs through residual dipolar splittings, the method comprising the steps of:

a) exciting the neighboring nucleus single quantum coherence;
   b) applying a delay of $\tau_{exc} \approx 1/(2D)$, wherein D is a splitting between the quadrupolar nuclei of $^{14}$N and the nuclei with spin S=½ due to residual dipolar splittings, leading to antiphase coherence;
   c) applying a first $^{14}$N RF-pulse of duration $\tau_p$ the quadrupolar nuclei of $^{14}$N having spin I=1 for transferring anti-phase coherence into heteronuclear coherence;
   d) applying a π-RF-pulse to the neighboring nucleus with spin S=½ in a middle of an evolution interval $t_1$;
   e) applying a second $^{14}$N RF-pulse at $t_1$ of duration $\tau_p$ to the quadrupolar nuclei of $^{14}$N having spin I=1, wherein to is an interval between centers of the first and the second $^{14}$N pulses; and
   f) recording the signal of the neighboring nucleus with spin S=½ after a duration $\tau_{rec} \approx 1/(2D)$ in $t_2$, wherein $t_2$ is the detection time interval.

2. The method of claim 1, wherein step a) comprises cross polarization from protons.

3. The method of claim 1, wherein the neighboring nucleus with spin S=½ is chosen from the group consisting of $^{13}$C, $^{31}$P, $^{15}$N, $^{29}$Si, and $^1$H.

4. The method of claim 1, wherein steps a) to f) are repeated for N rotor-synchronized increments $t_1 = n\Delta t_1$ with $\Delta t_1 = 1/\nu_{rot}$ and n=1, 2, 3 . . . N in a manner of two-dimensional spectroscopy, wherein $\nu_{rot}$ is a spinning frequency of the solid powder sample.

5. The method of claim 4, wherein time domain signals $S(t_1, t_2)$ are Fourier transformed with respect to $t_1$ to yield a spectrum of the quadrupolar nuclei of $^{14}$N having spin I=1 in an $\omega_1$ domain and with respect to $t_2$ to yield a spectrum of the neighboring nucleus with S=½ in an $\omega_2$ domainI.

6. The method of claim 1, wherein $(\pi/2)_\phi$ pulses are applied to the neighboring nucleus with S=½ at a beginning and at an end of the evolution interval $t_1$.

7. The method of claim 1, wherein a z-filter is used before a detection period.

8. The method of claim 1, wherein a quadrupolar coupling constant $C_Q$, an asymmetry parameter $\eta_Q$ of the quadrupolar nuclei of $^{14}$N having spin I=1, and a relative orientation of the quadrupolar tensor with respect to a bond between the quadrupolar nuclei of $^{14}$N having spin I=1 and the neighboring nucleus with S=½ are extracted from the obtained NMR spectra.

* * * * *